(12) United States Patent
Trask (10) Patent No.: US 6,393,267 B1
(45) Date of Patent: May 21, 2002

(54) LOSSLESS FEEDBACK DOUBLE-BALANCE ACTIVE MIXERS

(76) Inventor: Christopher Trask, 1863 E. Palmcroft Dr., Tempe, AZ (US) 85202-2858

(*) Notice: Subject to any disclaimer, the term of this patent is extended or adjusted under 35 U.S.C. 154(b) by 0 days.

(21) Appl. No.: 09/349,224

(22) Filed: Jul. 7, 1999

(51) Int. Cl.$^7$ ................................................ H04B 1/26
(52) U.S. Cl. ........................ 455/326; 327/113; 327/359
(58) Field of Search ................................. 327/113, 359; 455/313, 326, 333

(56) References Cited

U.S. PATENT DOCUMENTS

| | | | |
|---|---|---|---|
| 2,337,965 A | | 12/1943 | Bode |
| 3,891,934 A | | 6/1975 | Norton |
| 4,414,690 A | * | 11/1983 | Nordholt et al. ............ 455/283 |
| 4,635,296 A | * | 1/1987 | Dinsmore ................... 455/113 |
| 6,140,849 A | * | 10/2000 | Trask ......................... 327/113 |
| 6,242,964 B1 | * | 6/2001 | Trask ......................... 327/359 |

OTHER PUBLICATIONS

Norton, D.E., "High Dynamic Range Transistor Amplifiers with Lossless Feedback," Microwave Journal, May 1976, pp. 53–57.

Norton, D.E., "High Dynamic Range Transistor Amplifiers Using Lossless Feedback," Proceedings of the 1975 IEEE Int'l Symposium on Circuits and Systems, pp. 438–440.

Sarturi, E.F., "Hybrid Transformers," IEEE Transactions on Parts, Materials, and Packaging, vol. PMP–4, No. 3, Sep. 1968, pp. 59–66.

Trask, C., "A Linearized Active Mixer," Proceedings RF Design 98, San Jose, CA, Oct. 1998, pp. 13–23.

Trask, C., "Feedback Technique Improves Active Mixer Performance," RF Design, Sep. 1997, pp. 46–52.

* cited by examiner

*Primary Examiner*—Dwayne Bost
*Assistant Examiner*—Miguel D. Green (57) ABSTRACT

A low-noise, linearized double-balanced active mixer circuit is described, including a first input for a local oscillator (LO), a second input for an intermediate frequency (IF) signal, and an output for a resulting product radio frequency (RF) signal. The mixer circuit also includes a feedback transformer circuit for the purpose of improving the intermodulation (IM) performance. The lossless nature of the feedback topology gives the active mixer a lower noise figure (NF) characteristic than is realizable with conventional methods. According to a further embodiment, the mixer circuit includes an additional pair of complementary amplifier transistors for the purpose of further improving the IM performance.

9 Claims, 5 Drawing Sheets

LOSSLESS FEEDBACK DOUBLE-BALANCE ACTIVE MIXERS

BACKGROUND OF THE INVENTION

Mixers are used in communications circuits for the purpose of generating a modulated carrier for transmission, demodulating a modulated carrier in reception, or converting a signal at some input intermediate frequency (IF) to another output radio frequency (RF) by multiplying two input signals and thereby generating a third. A number of mixer realizations, both passive and active, are known in the art, and double-balanced mixers are known particularly well due to their advantages in the suppression of unwanted spurious signals and the isolation of any one of three ports to the other two, there generally being two inputs and one output. The Gilbert Cell has been the most widely used active mixer circuit for performing the above tasks, usually incorporated within an integrated circuit. It does, however, possess certain limitations in terms of intermodulation (IM) distortion and noise figure (NF) that precludes it's use in communications systems having demanding performance specifications. The series-shunt feedback mixer delivers a much improved IM performance, but the lossy nature of the feedback topology does not improve the NF performance.

Figure 1:
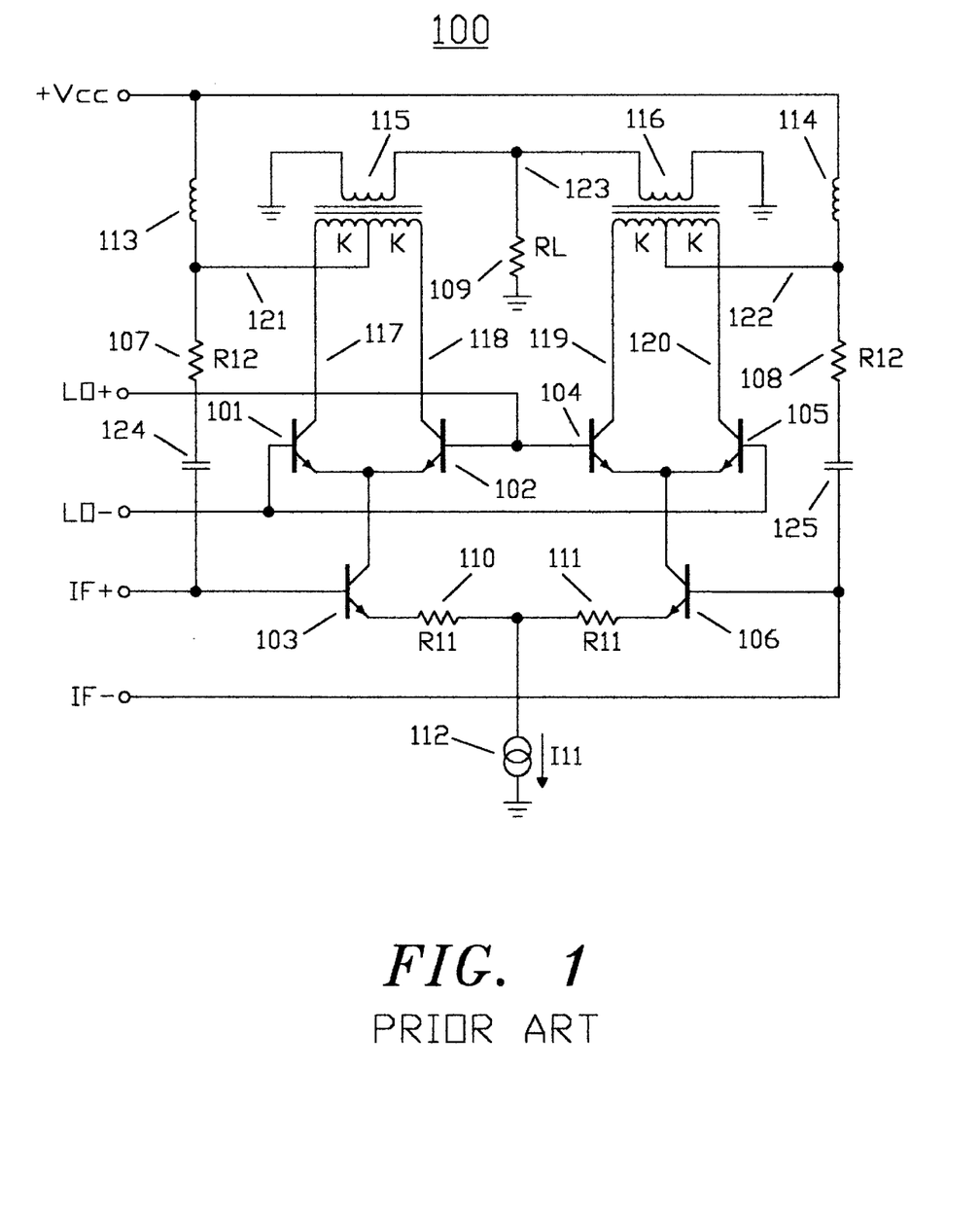
FIG. 1 schematically illustrates the existing prior art, commonly referred to as a series-shunt feedback double-balanced active mixer.

Referring to FIG. 1, a schematic diagram of a series-shunt feedback mixer is shown in a form that delivers exceptional overall performance. Here, the mixer is comprised of switching transistors 101, 102, 104, and 105, which are turned on (saturation) and off (cutoff) alternately by a differentially applied local oscillator (LO) signal. By this switching action, a pair of currents generated by amplifying transistors 103 and 106 are divided into four paths, there being two paths for each of two currents. The currents generated by switching transistors 103 and 106 are the result of an input intermediate frequency (IF) signal applied differentially across their respective base connections and the series feedback resistors 110 and 111. The current source 112 serves to establish the quiescent bias condition of the mixer. The hybrid transformers 115 and 116 combine the four currents from switching transistors 101, 102, 104, and 105, creating a pair of feedback voltages 121 and 122, as well as an output RF signal 123. The shunt feedback resistors 107 and 108, in conjunction with the series feedback resistors 110 and 111 and the amplifying transistors 103 and 106, form a pair of series-shunt feedback amplifiers which serve to establish the conversion gain and improve the IM performance of the mixer.

Those familiar with the art will readily understand that the NF performance of the series-shunt feedback mixer is impaired by the dissipative, or lossy, nature of the feedback topology. This active mixer does offer considerable advantages over the more traditional Gilbert Cell active mixer, especially in terms of signal-handling and performance variations over temperature due to the temperature dependency of the emitter resistance $r_e$, and the tradeoffs that are encountered in receiver and transmitter system design. It has long been desirable that a mixer, either passive or active, be available that has improved IM and temperature performance, and at the same time has an improved NF performance without the expense of added power or complexity.

It is the purpose of this invention to further advance the art of feedback mixers by addressing the sources of noise present in the series-shunt feedback mixer, and to therefore provide an active mixer of markedly improved NF performance, while at the same time conserving power consumption and retaining the IM performance and overall sense of simplicity and cost effectiveness of the series-shunt feedback mixer.

SUMMARY OF THE INVENTION

A lossless feedback double-balanced active mixer circuit with improved intermodulation (IM) and noise figure (NF) performance is described which includes a pair of lossless feedback balanced active mixer circuits, each of which includes a differential pair of switching transistors which divide a controlled current into two paths at a rate determined by an input local oscillator (LO). A hybrid transformer in each lossless feedback balanced mixer, consisting of a centre-tapped primary winding and a secondary winding, combines the two currents to provide a recombined amplified IF signal and an output radio frequency (RF) signal. A third amplifying transistor in each lossless feedback active mixer circuit provides the controlled current, which is determined by an input intermediate frequency (IF) signal. Each lossless feedback active mixer circuit further includes a feedback transformer, comprised of an input winding and a tapped output winding, which compares the input IF signal with the recombined amplified IF signal from the hybrid transformers and applies the difference as a correction to the amplifying transistors, thereby completing a lossless feedback amplifier circuit and in turn improving the IM performance of the mixer circuit. Since the feedback transformer is essentially lossless, it introduces no significant sources of noise to the active mixer circuit, and therefore the NF of the of the lossless feedback active mixer circuit remains unimpaired beyond the NF of the transistors themselves. An additional pair of complementary amplifying transistors may be added to improve the IM performance still further. The connection of the secondary windings of the hybrid transformers of the lossless feedback active mixer circuits effectively cancels the output LO and IF signals and provides an output RF signal.

BRIEF DESCRIPTION OF THE DRAWINGS

The invention is described in the schematics of FIGS. 1 to 5, in which.

DETAILED DESCRIPTION OF THE PREFERRED EMBODIMENT

Designers of radio communication receivers are always concerned with elements of system performance which includes, but is not limited to, intermodulation distortion (IM), noise figure (NF), and power consumption. Historically, the IM performance of communications receivers is improved by methods that invariably require additional power consumption. Amplification stages with feedback methods are widely used as they offer far better IM performance while consuming less power than those not employing feedback. The NF of communications receivers is determined by the NF performance of the first stages of the receiver, which usually have sufficiently low NF and suitable signal gain to overcome the IM and NF performance of the first mixer stage, which is traditionally the primary source of distortion and noise. This invention now presents a mixer circuit which achieves a markedly improved IM and NF performance without excessive power consumption by applying a feedback method widely used in amplifier design which introduces no significant noise sources in addition to those of the active devices themselves.

A typical series-shunt feedback double-balanced active mixer is shown in FIG. 1. Here, transistor 103 and resistor 107 and 110 form a series-shunt feedback amplifier on the left side, while transistor 106 and resistors 108 and 111 form a series-shunt feedback amplifier on the right side. Transistors 101 and 102 form a chopper for the left side and transistors 104 and 105 form a chopper for the right side. Hybrid transformer 115 combines the currents from transistors 101 and 102, the sum of which appears at the centre tap while the difference appears at the secondary winding. A similar description can be made for the second hybrid transformer 116 on the right side. If both hybrid transformers 115 and 116 have turns ratios of 1:1:1 (K=1), then the signals at the center taps of the hybrid transformers 115 and 116 are, respectively:

$$V_{121} = V_{CC} - A \times A_V \times \text{Cos } \omega_S t \quad (1)$$

$$V_{122} = V_{CC} + A \times A_V \times \text{Cos } \omega_S t \quad (2)$$

where $\omega_S$ is the frequency and A is the amplitude of the input Intermediate Frequency (IF) signal and $$A_V = 1 - \sqrt{\frac{R_{12}}{R_{11} + r_e}} \quad (3)$$

where $r_e$ is the incremental emitter resistance of amplifying transistors 103 and 106. Further, the signal voltages at the collectors of switching transistors 101, 102, 104, and 105 are, respectively:

$$V_{117} = V_{CC} + \frac{A \times A_V \times [\text{Cos}(\omega_L - \omega_S)t + \text{Cos}(\omega_L + \omega_S)t]}{2} \quad (4)$$

$$V_{118} = V_{CC} - \frac{A \times A_V \times [\text{Cos}(\omega_L - \omega_S)t + \text{Cos}(\omega_L + \omega_S)t]}{2} \quad (5)$$

$$V_{119} = V_{CC} + \frac{A \times A_V \times [\text{Cos}(\omega_L - \omega_S)t + \text{Cos}(\omega_L + \omega_S)t]}{2} \quad (6)$$

$$V_{120} = V_{CC} - \frac{A \times A_V \times [\text{Cos}(\omega_L - \omega_S)t + \text{Cos}(\omega_L + \omega_S)t]}{2} \quad (7)$$

where $\omega_L$ is the frequency of the input Local Oscillator (LO) signal. Finally, the output signal is:

$$V_{123} = A \times A_V \times [\text{Cos}(\omega_L - \omega_S)t + \text{Cos}(\omega_L + \omega_S)t] \quad (8)$$

Figure 2:
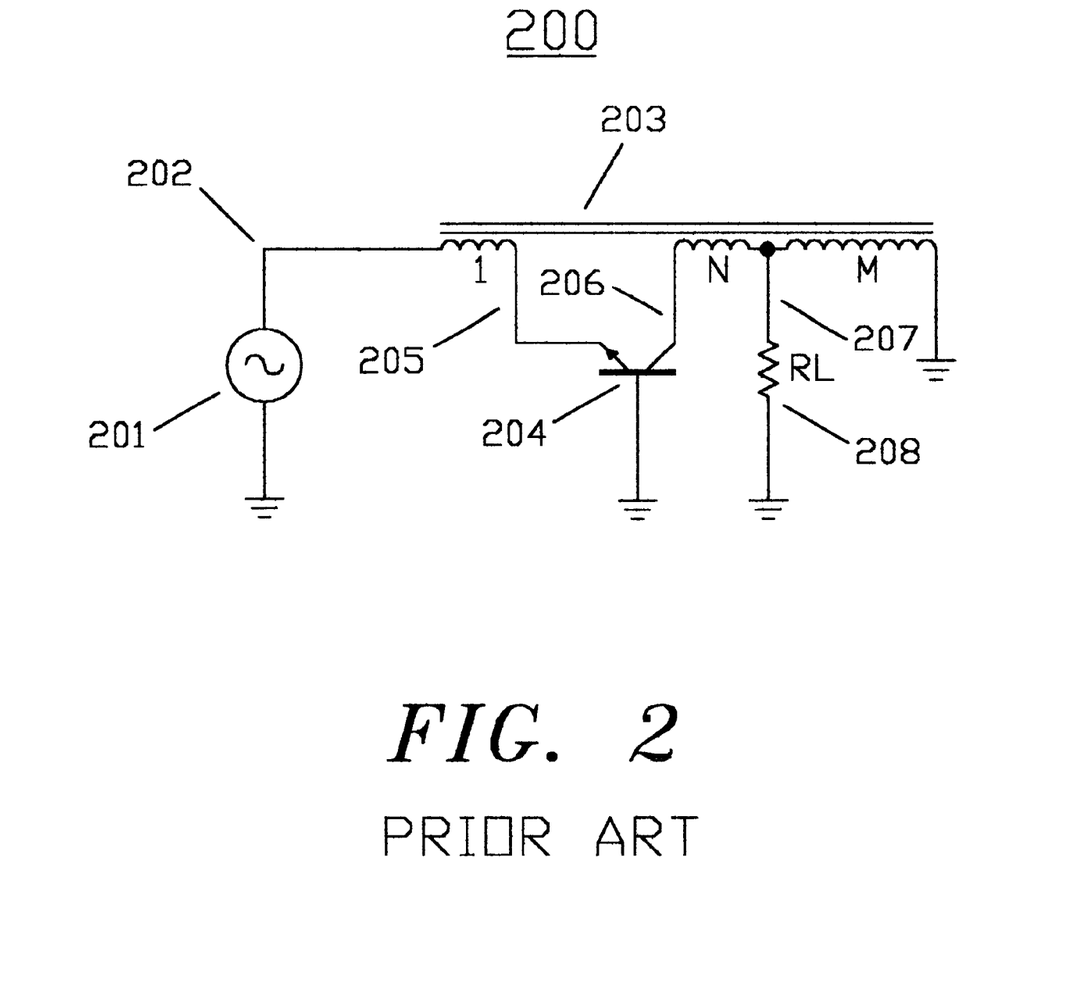
FIG. 2 schematically illustrates the existing prior art commonly referred to as a lossless feedback transistor amplifier.

Referring now to FIG. 2, a lossless feedback transistor amplifier circuit 200 is shown in its most basic form. Here, a transformer 203, having a turns ratio of 1:N:M, provides the feedback coupling from the collector to the emitter of transistor 204. An input signal voltage source 201 provides an input signal 202, having an amplitude A and a frequency $\omega_S$, which causes a current to flow through the input winding of transformer 203 and then into the emitter of transistor 204. This, in turn, causes a collector current from transistor 204 to flow into the output winding of transformer 203, thereby creating an output signal voltage 207 to appear across the load resistance 208 (illustrated as a fixed resistance $R_L$ for convenience). Briefly, the collector of transistor 204 sees a load resistance equal to:

$$R_{206} = (N+M) \times R_L \quad (9)$$

while the input resistance of the lossless feedback amplifier is:

$$R_{202} = \frac{M + N + 1}{M^2} \times R_L \quad (10)$$

and the power gain in dB is:

$$G_{dB} = N + M + 1 \quad (11)$$

Figure 3:
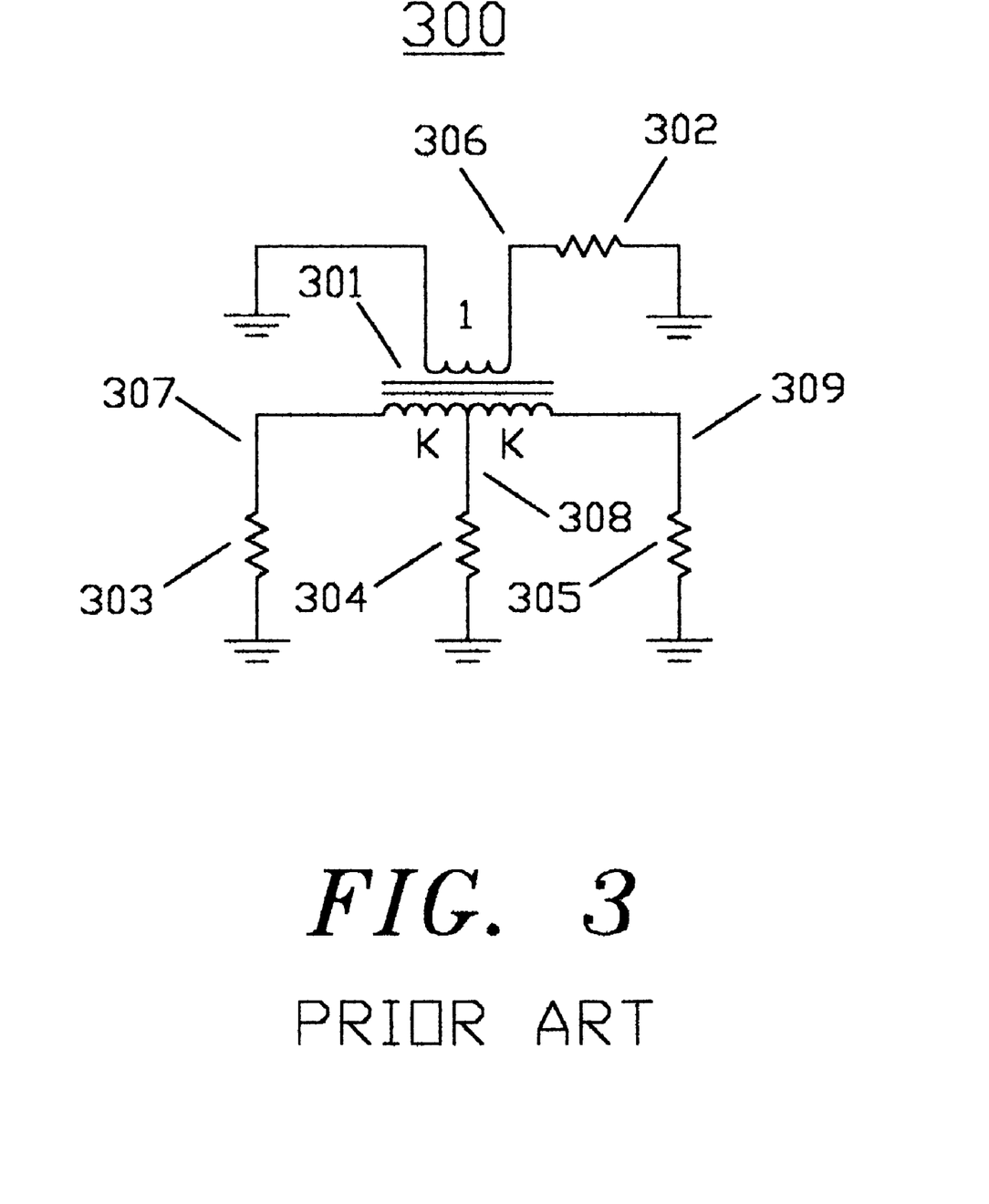
FIG. 3 schematically illustrates the existing prior art commonly referred to as a hybrid transformer.

Referring to FIG. 3, a circuit 300 is used as an aid in describing the impedances, voltages, and currents of the four ports of a hybrid transformer 301, which are:

$$R_{304} = K^2 \times R_{302} \quad (12)$$

$$R_{303} = R_{305} = 2 \times R_{304} \quad (13)$$

$$I_{306} = K \times (I_{309} - I_{307}) \quad (14)$$

$$I_{308} = I_{309} + I_{307} \quad (15)$$

$$V_{306} = \frac{V_{309} - V_{307}}{2 \times K} \quad (16)$$

$$V_{308} = \frac{V_{309} + V_{307}}{2} \quad (17)$$

Figure 4:
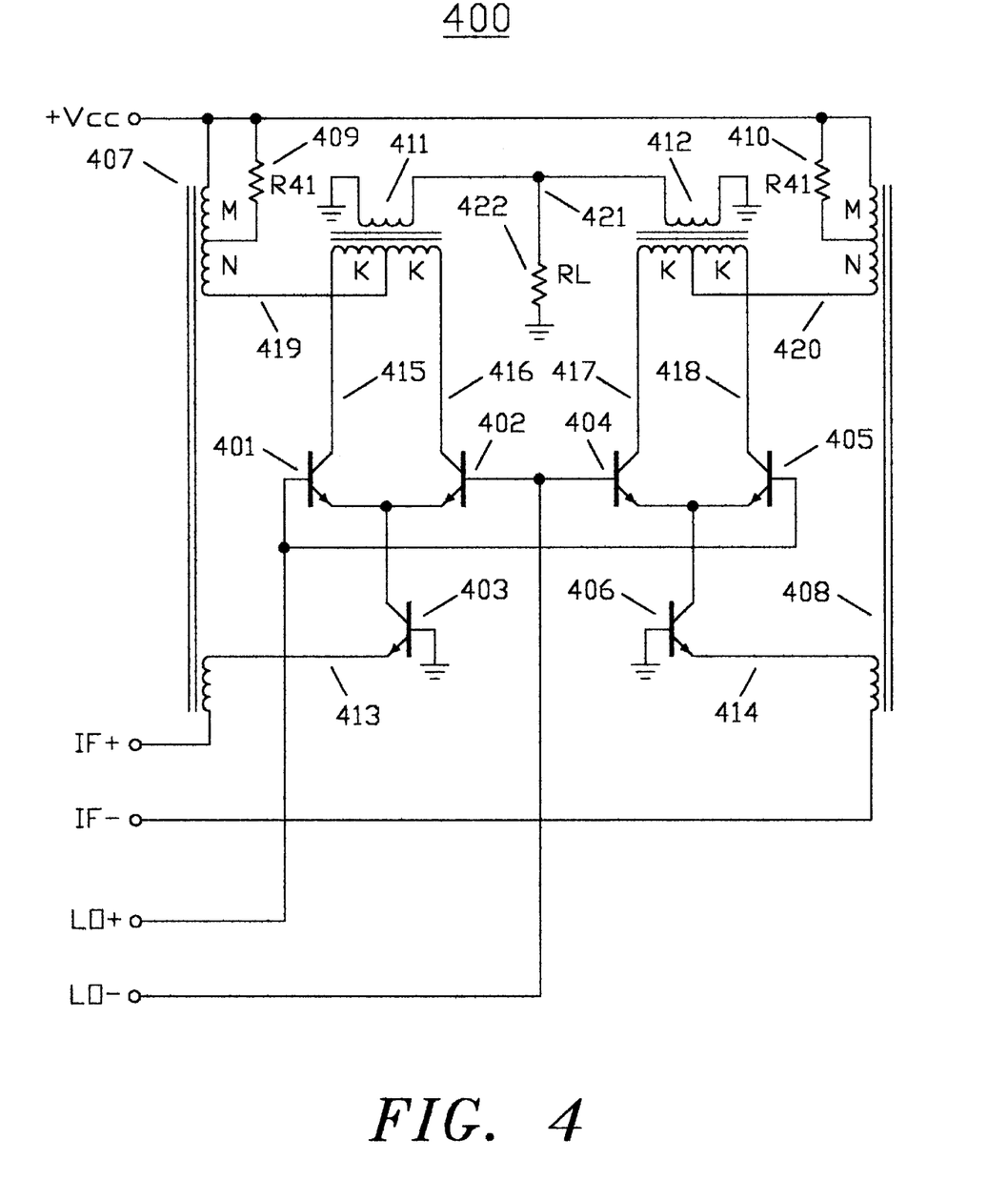
FIG. 4 schematically illustrates an embodiment of a lossless feedback double-balanced active mixer in accordance with the present invention.

Referring now to FIG. 4, a lossless feedback double-balanced active mixer circuit 400 in accordance with the present invention is illustrated. Mixer circuit 400 includes a first pair of switching transistors 401 and 402 and a second pair of switching transistors 404 and 405. The emitters of switching transistors 401 and 402 are connected in common to the collector of an amplifier transistor 403, the base of which is grounded. The emitter of the amplifier transistor 403 is connected to one end of an input winding of a lossless feedback transformer 407. The opposite end of the input winding is connected to receive one of a complementary pair of IF signals thereon. The emitters of switching transistors 404 and 405 are connected in common to the collector of an amplifier transistor 406, the base of which is grounded. The emitter of the amplifier transistor 406 is connected to one end of an input winding of a lossless feedback transformer 408. The opposite end of the input winding is connected to receive the other of the complementary pair of IF signals thereon. The bases of switching transistors 401 and 405 are connected together and to receive one of a complementary pair of local oscillator signals thereon. The bases of switching transistors 402 and 404 are connected together and to receive the other of the complementary pair of local oscillator signals thereon.

The collectors of switching transistors 401 and 402 are connected to opposite sides of a primary winding of a hybrid transformer 411. A centre tap of the primary winding is connected to one end of an output winding of lossless feedback transformer 407. The opposite end of the output winding is connected to a voltage source $V_{CC}$ and a tap of the output winding is connected through a load resistance 409 (illustrated as a fixed resistance $R_{41}$ for convenience) to voltage source $V_{CC}$. The collectors of switching transistors 404 and 405 are connected to opposite sides of a primary winding of a hybrid transformer 412. A centre tap of the primary winding is connected to one end of an output winding of lossless feedback transformer 408. The opposite end of the output winding is connected to a voltage source $V_{CC}$ and a tap of the output winding is connected through a load resistance 410 (illustrated as a fixed resistance $R_{41}$ for convenience) to voltage source $V_{CC}$. An RF output terminal 421 is connected through a secondary winding of hybrid transformer 411 to ground, through a secondary winding of hybrid transformer 412 to ground, and through resistance designated 422 (illustrated as a fixed resistance $R_L$ for convenience) to ground.

The input impedance of mixer circuit 400, as seen at either of the IF input ports, is determined from EQ. 10 by the value of the resistors 409 and 410, as well as the turns ratios of the lossless feedback transformers 407 and 408:

$$R_{in} = \frac{M + N + 1}{M^2} \times R_{41} \tag{18}$$

It is necessary that the impedance of the centre tap of hybrid transformers 411 and 412 be matched to the collector load impedance of the lossless feedback transformers 407 and 408, respectively:

$$R_{419} = (M+N) \times R_{41} = 2 \times K^2 \times R_L \tag{19}$$

$$R_{41} = \frac{2 \times K^2 \times R_L}{M + N} \tag{20}$$

which forces the IF input impedance of both sides of the double-balanced lossless feedback active mixer circuit to be:

$$R_{in} = \frac{2 \times K^2 \times R_L \times (M + N + 1)}{M^2 \times (M + N)} \tag{21}$$

These conditions being satisfied, the input currents to the emitters of amplifying transistors 403 and 406 are, respectively:

$$I_{413} = I_Q + \frac{A \times \cos\omega_S t}{R_{in}} \tag{22}$$

$$I_{414} = I_Q - \frac{A \times \cos\omega_S t}{R_{in}} \tag{23}$$

where $I_Q$ is the quiescent bias current for amplifying transistors 403 and 406, A is the amplitude and $\omega_S$ is the frequency of the input IF signal voltage. The current at the collectors of switching transistors 401, 402, 404, and 405 are, respectively:

$$I_{415} = I_{403} \times \frac{1 - \cos\omega_L t}{2} = \tag{24}$$
$$= \frac{I_Q \times (1 - \cos\omega_L t)}{2} + \frac{A \times \left[\cos\omega_S t - \frac{\cos(\omega_S - \omega_L)t + \cos(\omega_S + \omega_L)t}{2}\right]}{2 \times R_{in}}$$

$$I_{416} = I_{403} \times \frac{1 + \cos\omega_L t}{2} = \tag{25}$$
$$= \frac{I_Q \times (1 + \cos\omega_L t)}{2} + \frac{A \times \left[\cos\omega_S t + \frac{\cos(\omega_S - \omega_L)t + \cos(\omega_S + \omega_L)t}{2}\right]}{2 \times R_{in}}$$

$$I_{417} = I_{406} \times \frac{1 + \cos\omega_L t}{2} = \tag{26}$$
$$= \frac{I_Q \times (1 + \cos\omega_L t)}{2} - \frac{A \times \left[\cos\omega_S t + \frac{\cos(\omega_S - \omega_L)t + \cos(\omega_S + \omega_L)t}{2}\right]}{2 \times R_{in}}$$

$$I_{418} = I_{406} \times \frac{1 - \cos\omega_L t}{2} = \tag{27}$$
$$= \frac{I_Q \times (1 - \cos\omega_L t)}{2} - \frac{A \times \left[\cos\omega_S t - \frac{\cos(\omega_S - \omega_L)t + \cos(\omega_S + \omega_L)t}{2}\right]}{2 \times R_{in}}$$

The currents at the centre taps of hybrid transformers 411 and 412 are, respectively:

$$I_{419} = I_{415} + I_{416} = I_Q + \frac{A \times \cos\omega_S t}{R_{in}} \tag{28}$$

$$I_{420} = I_{417} + I_{418} = I_Q - \frac{A \times \cos\omega_S t}{R_{in}} \tag{29}$$

and the output current is:

$$I_{421} = K \times (I_{415} - I_{416}) - K \times (I_{417} - I_{418}) = \tag{30}$$
$$= 2 \times A \times K^2 \times \frac{\cos(\omega_S - \omega_L)t + \cos(\omega_S + \omega_L)t}{R_{in}}$$

which makes the output voltage equal to:

$$V_{421} = 2 \times A \times K^2 \times R_L \times \frac{\cos(\omega_S - \omega_L)t + \cos(\omega_S + \omega_L)t}{R_{in}} \tag{31}$$

Figure 5:
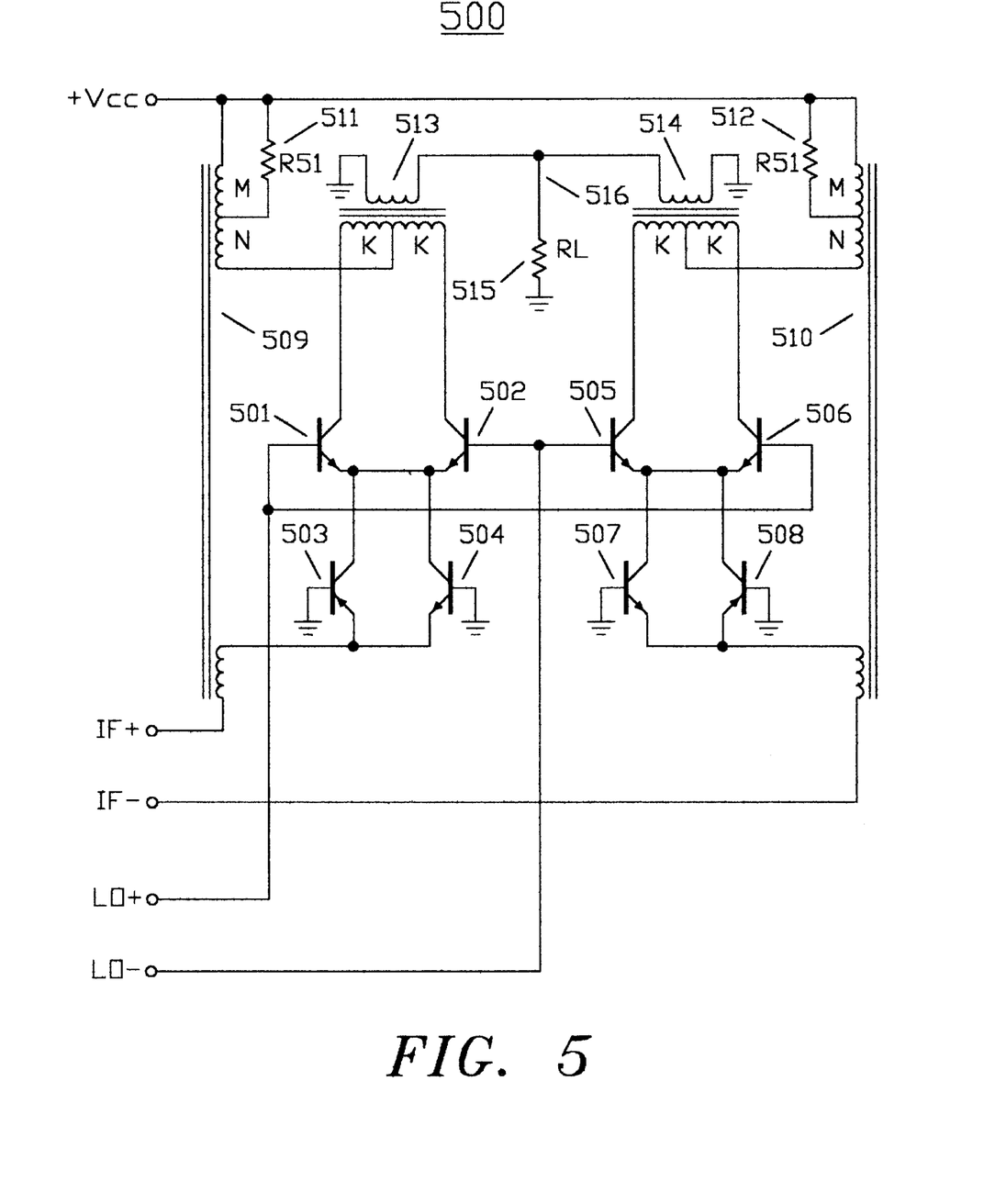
FIG. 5 schematically illustrates the addition of a pair of complementary amplifying transistors as a further embodiment of the lossless feedback double-balanced active mixer of FIG. 4.

Referring now to FIG. 5, a further embodiment of a double-balanced lossless feedback active mixer circuit 500 in accordance with the present invention is shown. Mixer circuit 500 includes a first pair of switching transistors 501 and 502 and a second pair of switching transistors 505 and 506. The emitters of switching transistors 501 and 502 are connected in common to the common connected collectors of a pair of complementary amplifier transistor 503 and 504, the bases of which are grounded and the common connected emitters of which are connected to one end of an input winding of a lossless feedback transformer 509. The opposite end of the input winding is connected to receive one of a complementary pair of IF signals thereon. The emitters of switching transistors 505 and 506 are connected in common to the common connected collectors of a pair of complementary amplifier transistor 507 and 508, the bases of which are grounded and the common connected emitters of which are connected to one end of an input winding of a lossless feedback transformer 510. The opposite end of the input winding is connected to receive the other of the complementary pair of IF signals thereon. The bases of switching transistors 501 and 506 are connected together and to receive one of a complementary pair of local oscillator signals thereon. The bases of switching transistors 502 and 505 are connected together and to receive the other of the complementary pair of local oscillator signals thereon.

The collectors of switching transistors 501 and 502 are connected t o opposite sides of a primary winding of a hybrid transformer 513. A centre tap of the primary winding is connected to one end of a tapped output winding of lossless feedback transformer 509, which has turns ratios of M and N with respect to the input winding. The opposite end of the output winding is connected to a voltage source $V_{CC}$ and a tap of the output winding is connected through a resistance 511 (illustrated as a fixed resistance $R_{51}$ for convenience) to voltage source $V_{CC}$. The collectors of switching transistors 505 and 506 are connected to opposite sides of a primary winding of a hybrid transformer 514. A centre tap of the primary winding is connected to one end of a tapped output winding of lossless feedback transformer 510, which has turns ratios of M and N with respect to the input winding. The opposite end of the output winding is connected to a voltage source $V_{CC}$ and a tap of the output winding is connected through a resistance 512 (illustrated as a fixed resistance $R_{51}$ for convenience) to voltage source $V_{CC}$. An RF output terminal 516 is connected through a secondary winding of hybrid transformer 513 to ground, through a secondary winding of hybrid transformer 514 to ground, and through a load resistance 515 (illustrated as a fixed resistance $R_{41}$ for convenience) to ground. The various gain and impedance relationships for mixer circuit 500 are identical to those established earlier for mixer circuit 400.

Although detailed embodiments of the invention have been described, it should be appreciated that numerous modifications, variations, and adaptations may be made without departing from the scope of the invention as described in the claims. For example, those familiar with the art will recognize that the bipolar transistors shown in the embodiments may be alternatively replaced with field effect transistors. Also, the single-transformer lossless feedback topology shown in the embodiments may be alternatively replaced with other forms of lossless feedback that are known to the art.

Further, while the terminals of the bipolar transistors described in the various embodiments are referred to as the emitter, base and collector, it will be understood that these terminals will be the source, gate and drain when the transistors utilized are field effect transistors or other similar types and may be referred to as input, control and output terminals, respectively, however the titles of the various components and terminals are only intended to enhance the understanding of the disclosure and are not intended to in any way limit the type of component utilized. In addition, it should be understood that the terms "lossless feedback transformer" and "hybrid transformer" used throughout this disclosure refer to general types of transformers and should not be limited in any way to specific types of transformers.

What is claimed is:

1. A lossless feedback double-balanced active mixer circuit for mixing an input intermediate frequency (IF) signal and an input local oscillator (LO) signal and producing an output radio frequency (RF) signal comprising:

a pair of IF input terminals for receiving differential first and second IF input signals, including a first IF signal input terminal for receiving the first IF input signal and a second IF signal input terminal for receiving the second IF input signal;

a pair of LO input terminals for receiving differential first and second LO input signals;

an RF output terminal for providing an RF output signal;

a first lossless feedback balanced active mixer circuit having an IF signal input connected to the first IF signal input terminal of the lossless feedback double-balanced active mixer circuit, a first and second differential LO signal inputs connected to the pair of LO input terminals of the lossless feedback double-balanced active mixer circuit, and an RF signal output connected to the RF output terminal of the lossless feedback double-balanced active mixer circuit; and a second lossless feedback balanced active mixer circuit having an IF signal input connected to the second IF signal input terminal of the lossless feedback double-balanced active mixer circuit, a first and second differential LO signal inputs connected to the pair of LO input terminals of the lossless feedback double-balanced active mixer circuit, and an RF signal output connected to the RF output terminal of the lossless feedback double-balanced active mixer circuit.

2. A lossless feedback double-balanced active mixer circuit, as claimed in claim 1, wherein the first and second lossless feedback balanced active mixer circuits each include a differential pair of switching transistors having an output coupled through a hybrid transformer to the RF output terminal and having an input connected to the output of an amplifier, and a feedback transformer coupling the output of the differential pair of switching transistors to an input of the amplifier.

3. A lossless feedback double-balanced active mixer circuit, as claimed in claim 1, wherein the lossless feedback active mixer circuit further comprises:

an amplifier, having an input and an output;

a hybrid transformer, having a primary winding having a first and second input and a centre-tap output, and a secondary winding with first and second ends, the first end being connected to the RE output of the lossless feedback balanced mixer circuit and the second end connected to a signal ground;

a differential pair of switching transistors having a pair of collectors connected to the first and second inputs of the hybrid transformer respectively, the differential pair of switching transistors having a pair of bases connected to the pair of LO input terminals of the lossless feedback active mixer circuit respectively, and the differential pair of switching transistors having a pair of emitters connected in common to the amplifier output; and a lossless feedback transformer including a first input winding with a first end connected to the IF input terminal and a second end connected to the input of the amplifier, the lossless feedback transformer further including a tapped output winding with the first end connected to the centre-tap of the hybrid transformer primary winding, a second end coupled to a common point, such as ground, and the tap coupled through a load resistance to the common point.

4. A lossless feedback balanced active mixer circuit, as claimed in claim 3, wherein the amplifier circuit further comprises a common-base transistor, the emitter coupled to the amplifier input, the collector coupled to the amplifier output, and the base connected to the signal ground.

5. A lossless feedback balanced active mixer circuit, as claimed in claim 3, wherein the amplifier circuit further includes a complementary pair of common-base transistors, an emitter of the first transistor and an emitter of the second transistor being connected to the amplifier input, a collector of the first transistor and a collector of the second transistor being connected to the amplifier output, a base of the first transistor being connected to a signal ground, and a base of the second transistor being connected to a signal ground.

6. A lossless feedback double-balanced active mixer circuit for mixing an input intermediate frequency (IF) signal and an input local oscillator (LO) signal and producing an output radio frequency (RF) signal comprising:

a pair of IF input terminals for receiving differential first and second IF signals, including a first IF signal input terminal for receiving the first IF input signal and a second IF signal input terminal for receiving the second IF input signal;

a pair of LO input terminals for receiving differential first and second LO input signals;

an RF output terminal for providing an RF output signal;

a first lossless feedback balanced active mixer circuit having an IF signal input connected to the first IF signal input terminal, first and second differential LO signal inputs connected to the pair of LO input terminals, and the first lossless feedback balanced active mixer circuit including a differential pair of switching transistors having an input connected to the output of an amplifier and further including a pair of outputs connected through a hybrid transformer to an RF output connected to the RF output terminal, the hybrid transformer further providing an amplified IF output, and a lossless feedback transformer coupling the amplified IF output of the hybrid transformer to an input of the amplifier, and a second lossless feedback balanced active mixer circuit having an IF signal input connected to the second IF signal input terminal, first and second differential LO signal inputs connected to the pair of LO input terminals, and the second lossless feedback balanced active mixer circuit including a differential pair of switching transistors having an input connected to the output of an amplifier and further including a pair of outputs connected through a hybrid transformer to an RF output connected to the RF output terminal, the hybrid transformer further providing an amplified IF output, and a lossless feedback transformer coupling the amplified IF output of the hybrid transformer to an input of the amplifier.

7. A method of combining an input intermediate frequency (IF) signal and an input local oscillator (LO) signal and providing a linearized output radio frequency (RF) signal comprising the steps of:

providing a differential first and second IF input signal;

providing a differential LO input signal;

combining the first IF input signal, a first IF feedback signal, and the differential LO input signal by a first magnetic coupling means and a first mixing means, producing a differential first and second linearized RF signal;

combining the second IF input signal, a second IF feedback signal, and the differential LO input signal by a second magnetic coupling means and a second mixing means, producing a differential third and fourth linearized RF signal; and combining the first, second, third, and fourth linearized RF signals by a differencing and summation means, producing a first IF feedback signal, a second IF feedback signal, and a linearized RF output signal.

8. A method of combining an input intermediate frequency (IF) signal and an input local oscillator (LO) signal and providing a linearized output radio frequency (RF) signal as claimed in claim 7 wherein the first mixing means consists of a first common-base transistor amplifier having the emitter coupled to the first magnetic coupling means, the base connected to a signal ground, and the collector coupled to the common emitter connection of a first differential pair of transistors which have their bases coupled to the differential LO input signal, the collector of the first differential transistor producing the first linearized RF signal and the collector of the second differential transistor producing the second linearized RF signal.

9. A method of combining an input intermediate frequency (IF) signal and an input local oscillator (LO) signal and providing a linearized output radio frequency (RF) signal as claimed in claim 7 wherein the second mixing means consists of a second common-base transistor amplifier having the emitter coupled to the second magnetic coupling means, the base connected to a signal ground, and the collector coupled to the common emitter connection of a second differential pair of transistors which have their bases coupled to the differential LO input signal, the collector of the first differential transistor producing the third linearized RF signal and the collector of the second differential transistor producing the fourth linearized RF signal.

* * * * *